United States Patent [19]

Haynes et al.

[11] Patent Number: 4,514,684
[45] Date of Patent: Apr. 30, 1985

[54] ACOUSTIC WAVEGUIDE VOLTAGE MONITOR

[75] Inventors: Kenton L. Haynes; William P. Sherer, both of Huntsville; Hugh W. Greene, Somerville; James D. Holder; Thomas G. Roberts, both of Huntsville, all of Ala.

[73] Assignee: The United States of America as represented by the Secretary of the Army, Washington, D.C.

[21] Appl. No.: 423,973

[22] Filed: Sep. 27, 1982

[51] Int. Cl.³ ............................................. G01R 19/18
[52] U.S. Cl. .................................. 324/120; 333/133; 324/103 P
[58] Field of Search .................... 333/133, 154, 24 R; 310/334; 330/10; 328/221, 265; 332/2; 331/107 A; 324/120, 123 R

[56] References Cited

U.S. PATENT DOCUMENTS 4,151,464  4/1979  Cooper ........................... 324/103 P
4,281,299  7/1981  Newbold ........................ 333/133
4,437,058  3/1984  Kinoshita ....................... 324/120

Primary Examiner—Michael J. Tokar
Attorney, Agent, or Firm—Anthony T. Lane; Robert P. Gibson; Robert C. Sims

[57] ABSTRACT

The monitor system consists of a voltage controlled oscillator for producing an acoustic wave whose frequency is proportional to the voltage being measured. An acoustic waveguide is used for transmitting the wave to an electrically isolated acoustic to electrical transducer. The output of the transducer is amplified and then displayed on an appropriate readout calibrated in volts.

1 Claim, 5 Drawing Figures 4,514,684

ACOUSTIC WAVEGUIDE VOLTAGE MONITOR

DEDICATORY CLAUSE

The invention described herein may be manufactured, used, and licensed by or for the Government for governmental purposes without the payment to us of any royalties thereon.

BACKGROUND OF THE INVENTION

In the development of pulses power technology for driving multi-megavolt devices, diagnostics are required where differential voltages must be monitored at locations which may be at high voltage relative to ground. Additional problems arise when these high voltages are developed in a short time frame which causes abrupt high frequency changes in the electric and magnetic fields (RF noise). For example it is sometimes desired to monitor the voltage on the last capacitor in a many stages marx bank to determine when the marx is fully charged and ready for erection to a very high voltage. In such a case the voltage measuring device must monitor the voltage on the last capacitor to a sufficient degree of accuracy during charging; and upon erection of the marx to its high output voltage, this voltage monitoring device must be isolated from ground. Also, it must be immune to damage by suddenly changing fields within the marx. This implies that a power supply must be contained in the monitoring device which has sufficient stored energy for long time operation.

Conventional voltage measuring devices such as resistive and capacitive voltage dividers cannot be readily used for this purpose because of the high voltage breakdown problems which develop when this voltage suddenly rises to the multimegavolt level. The acoustic waveguide voltage monitor disclosed here is not vulnerable to the above problems in that the necessary electrical isolation is obtained by the acoustic waveguide, and the protection from high frequency fields is accomplished by use of a suitably designed Faraday shielded case work and filtering and clamping techniques on the differential voltage monitoring lines. The necessary electrical isolation is obtained by the use of the acoustic waveguide and is much cheaper, less fragile, and suitable tubing may already be inherent in the system. Many such systems require pressurization of internal components by insulating gas, and the supply tubing is by necessity of sufficient voltage isolation so that it might be used as an acoustic waveguide.

DETAIL DESCRIPTION OF THE BEST MODE AND PREFERRED EMBODIMENT

Figure 1:
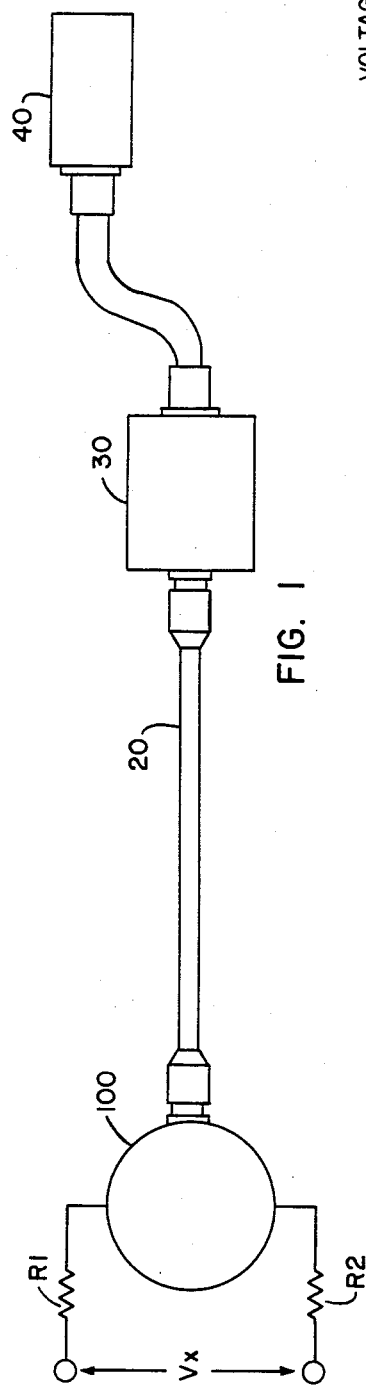
FIG. 1 is a schematic illustration of the acoustic waveguide voltage monitor.
Figure 4:
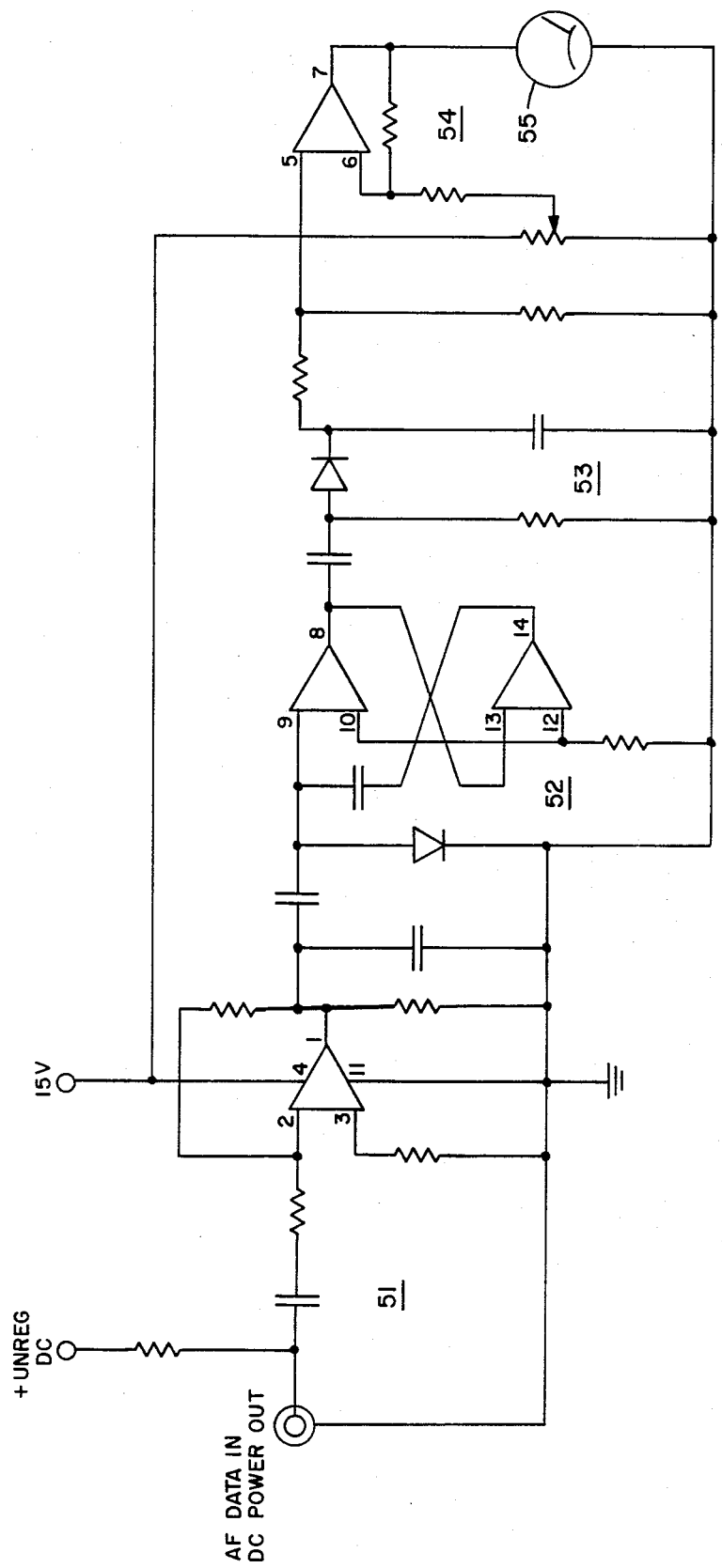
FIG. 4 is an electrical schematic of an anolog voltage display unit.
Figure 5:
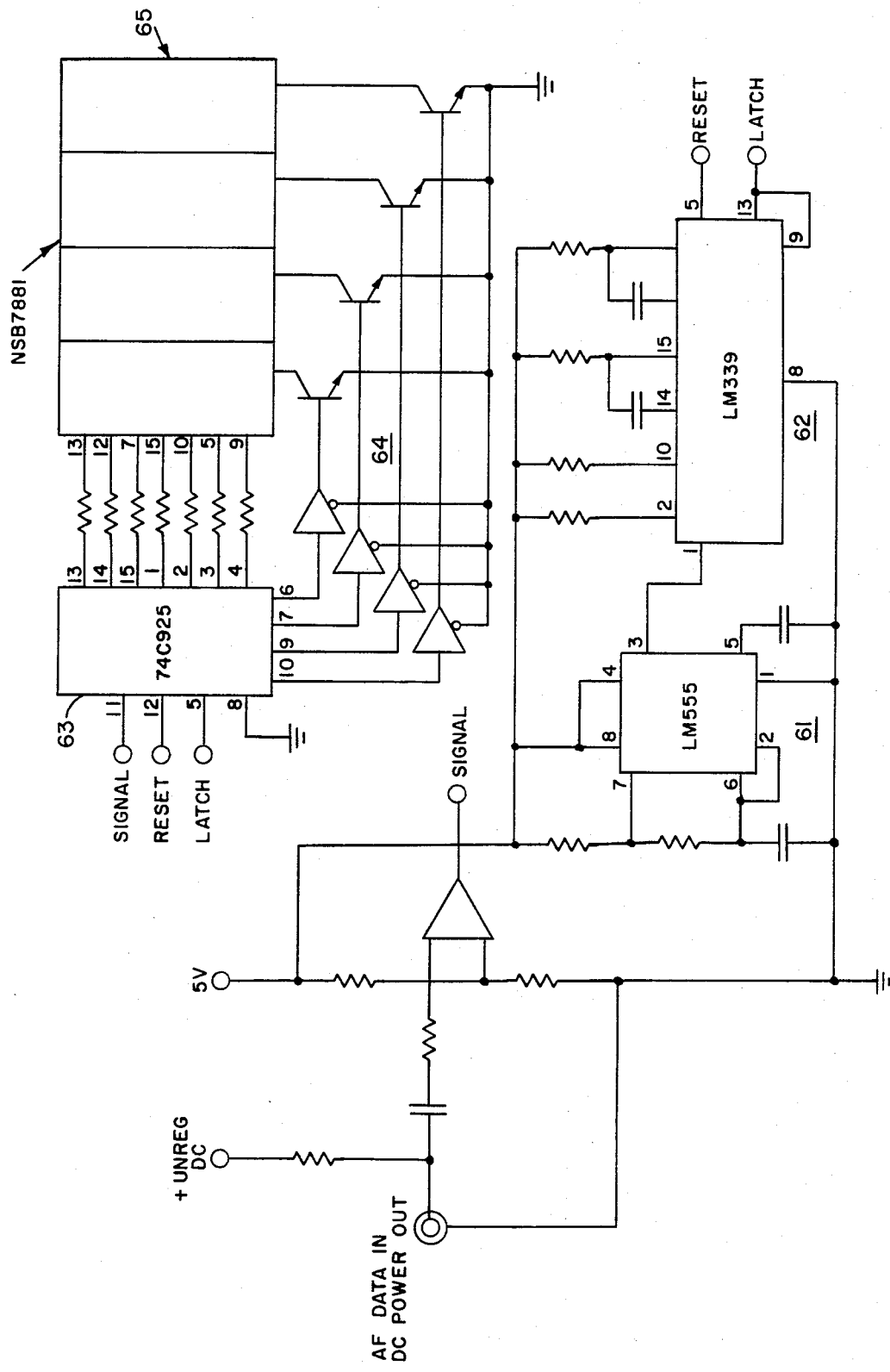
FIG. 5 is an electrical schematic of a digital voltage display unit.

Referring to the drawings, in FIG. 1 the acoustic waveguide voltage monitor consist of four essential components as follows: The differential voltage to acoustic wave transducer 100, the acoustic waveguide 20, the acoustic wave to electrical signal transducer 30, and the voltage display unit 40, which may be either digital or anolog. In operation, as the marx is being charged the voltage, Vx, which is to be monitored is changing relatively slowly with time, thus causing the frequency that is produced by the Voltage Controlled Oscillator (VCO) in the differential voltage to acoustic wave transducer 100 to increase. This produces an acoustic wave which is propagated along the length of the acoustic waveguide 20 to the acoustic wave to electrical signal transducer 30. The acoustic waveguide 20 allows the acoustic wave to electrical signal transducer 30 to be placed at any convenient location and at ground potential. The output of the acoustic wave to electrical signal transducer 30 is transmitted to the voltage display unit 40 which may be either anolog or digital as indicated in FIGS. 4 and 5. Once the marx has been erected (It is at this time that the protection from damage caused by high frequency electric and magnetic fields is necessary) and its charge has been transfered to the desired load, the voltage Vx and the reading on the voltage display unit return to zero. At this time the whole process may be repeated if desired.

Figure 2:
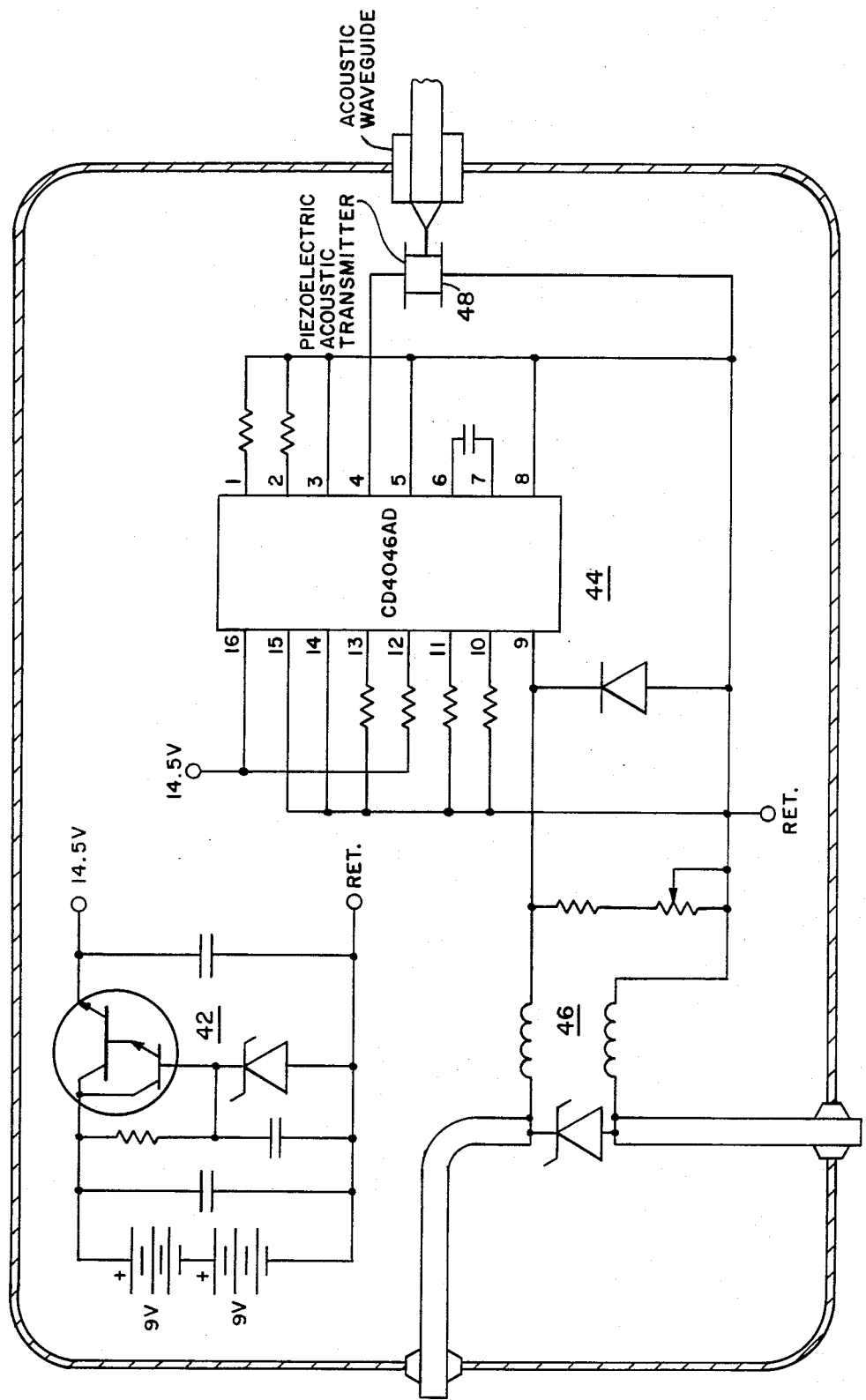
FIG. 2 is an electrical schematic of the differential voltage to acoustic wave transducer.

FIG. 2 shows details of the differential voltage to acoustic wave transducer 100. This device consists of a low power consumption voltage regulator 42, a VCO circuit 44, a voltage sensing and protection circuit 46, and an acoustic wave transmitter 48. Although specific component types and values are shown in FIG. 2, these were values for a specific application. The operation of these units is apparent from the drawing and is not present here. Other component types and values may be required for other applications.

The acoustic waveguide 20 is not shown in detail. It consists of a gas filled insulating tube which in the specific application was a ¼ inch nylon tube filled with ambient air.

Figure 3:
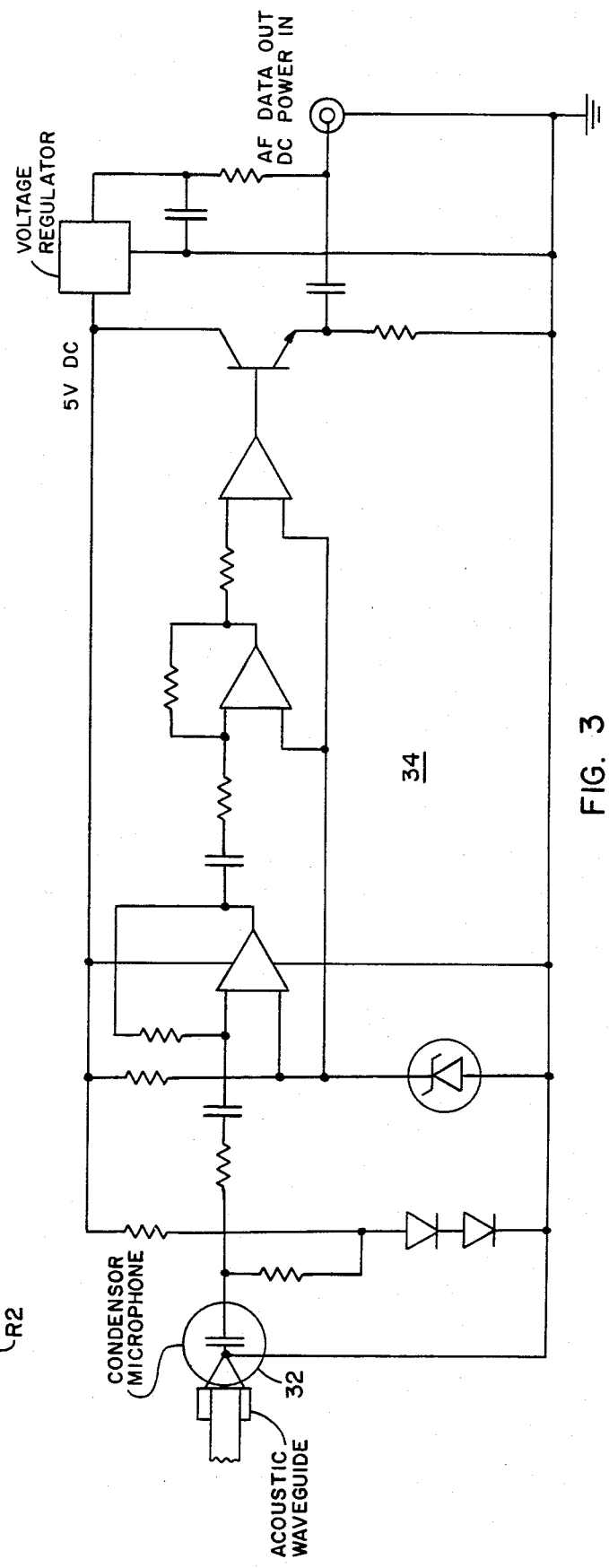
FIG. 3 is an electrical schematic of the acoustic wave to electrical signal transducer.

FIG. 3 shows details of one possible acoustic wave to electrical signal transducer 30. This device consists of an appropriate acoustic receiver 32 which in our application was a microphone and an amplifing circuit 34 which is known in the art. This circuit amplifies the output of the microphone and converts it to an audio-frequency electrical signal for transmitting by wire to the voltage display unit. In our application this signal was multiplexed on the same wire which connected the dc power for operating the electronic circuitry of 30. Again the operation would be obvious to one skilled in the art and is not presented here.

FIG. 4 shows the details of one possible anolog voltage display unit 40. This unit is a modified form of an electronic tachometer circuit, and consists of an audio frequency dc power decoupler 51. Audio amplifier stage, a monostable multi-vibrator 54 which drives the display meter 55.

FIG. 5 shows the details of one possible digital voltage display unit 40. This unit is known in the art as a digital display counter; and consists of a control clock 61, a control pulse generator circuit 12, a counter 63 with a seven segment, four digit multiplexed display driver 64, and a four digit multiplexed LED display 65.

It can be seen that this invention provides an acoustic waveguide voltage monitor which has sufficient electrical isolation to be used in locations which may suddenly rise in potential to the multi-megavolt level. This invention also provides a device which has a self-contained power supply capable of long life. The invention provides a device which is not damaged by high frequency changes in the electric and magnetic fields.

We claim:

1. A measurement system in which the voltage to be measured may suddenly rise in potential to the multimegavolt level from a relatively low initial voltage level; a voltage controlled oscillator having an input connected to the voltage to be measured; the output of the voltage controlled oscillator being a frequency which is proportional to the voltage to be measured; an acoustical transmitter having an input connected to the output of the oscillator and having an output which has an acoustical signal thereon; an acoustical waveguide connected to the output of said acoustical transmitter as to electrically isolate and transmit the acoustical signal to a remote location; a measuring device connected to said acoustical waveguide so as to convert the acoustical signal back to a representation of the voltage to be measured; a power system connected to the voltage control oscillator; and both the power system and the voltage control oscillator being located in the environment of the voltage to be measured.

* * * * *